(12) United States Patent
Miao et al.

(10) Patent No.: US 10,903,123 B2
(45) Date of Patent: Jan. 26, 2021

(54) HIGH THRESHOLD VOLTAGE FET WITH THE SAME FIN HEIGHT AS REGULAR THRESHOLD VOLTAGE VERTICAL FET

(71) Applicant: INTERNATIONAL BUSINESS MACHINES CORPORATION, Armonk, NY (US)

(72) Inventors: Xin Miao, Slingerlands, NY (US); Kangguo Cheng, Schenectady, NY (US); Chen Zhang, Albany, NY (US); Wenyu Xu, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/572,743

(22) Filed: Sep. 17, 2019

(65) Prior Publication Data

US 2020/0013677 A1 Jan. 9, 2020

Related U.S. Application Data

(63) Continuation of application No. 15/951,355, filed on Apr. 12, 2018, now Pat. No. 10,490,453.

(51) Int. Cl.
*H01L 21/8234* (2006.01)
*H01L 29/66* (2006.01)
(Continued)

(52) U.S. Cl.
CPC .... *H01L 21/823456* (2013.01); *H01L 21/311* (2013.01); *H01L 21/3213* (2013.01);
(Continued)

(58) Field of Classification Search
CPC ..... H01L 21/823456; H01L 21/823487; H01L 27/088; H01L 21/3213; H01L 21/823462; H01L 21/311
See application file for complete search history.

(56) References Cited

U.S. PATENT DOCUMENTS 8,372,755 B2    2/2013   Wang et al.
8,389,371 B2    3/2013   Wang
(Continued)

OTHER PUBLICATIONS

List of IBM Patents or Patent Applications Treated as Related; (Appendix P); Date Filed: Sep. 17, 2019, 2 pages.
(Continued)

*Primary Examiner* — Ahmed N Sefer
(74) *Attorney, Agent, or Firm* — Cantor Colburn LLP; Daniel Morris

(57) ABSTRACT

A technique relates to a semiconductor device. A first vertical fin is formed with a first gate stack and a second vertical fin with a second gate stack. The second vertical fin has a hardmask on top. The first vertical fin is adjacent to a first bottom source or drain (S/D) region and the second vertical fin is adjacent to a second bottom S/D region. The first gate stack is reduced to a first gate length and the second gate stack to a second gate length, the second gate length being greater than the first gate length because of the hardmask. The hardmask is removed. A first top S/D region is adjacent to the first vertical fin and a second top S/D region is adjacent to the second vertical fin.

20 Claims, 10 Drawing Sheets

(51) Int. Cl.
  *H01L 29/423* (2006.01)
  *H01L 29/78* (2006.01)
  *H01L 21/311* (2006.01)
  *H01L 21/3213* (2006.01)

(52) U.S. Cl.
  CPC ............. *H01L 21/823462* (2013.01); *H01L 29/42376* (2013.01); *H01L 29/6656* (2013.01); *H01L 29/7827* (2013.01)

(56) References Cited

U.S. PATENT DOCUMENTS

| | | |
|---|---|---|
| 8,637,849 B2 | 1/2014 | Deligianni et al. |
| 9,324,792 B1 | 4/2016 | Cao et al. |
| 9,570,356 B1 * | 2/2017 | Balakrishnan .... H01L 21/82348 |
| 9,653,465 B1 * | 5/2017 | Balakrishnan ...... H01L 29/7827 |
| 9,716,155 B2 | 7/2017 | Balakrishnan et al. |
| 9,806,153 B1 | 10/2017 | Cheng et al. |
| 9,837,553 B1 | 12/2017 | Wu et al. |
| 2009/0189222 A1 | 7/2009 | Shino |
| 2012/0313169 A1 | 12/2012 | Wahl et al. |
| 2015/0145048 A1 * | 5/2015 | Cheng ................. H01L 27/1211 257/351 |
| 2015/0187867 A1 | 7/2015 | Basker et al. |
| 2016/0307890 A1 | 10/2016 | Yeo et al. |
| 2016/0351570 A1 | 12/2016 | Park et al. |
| 2017/0054027 A1 | 2/2017 | Liu |
| 2017/0162446 A1 | 6/2017 | Balakrishnan et al. |
| 2017/0170287 A1 * | 6/2017 | Balakrishnan ...... H01L 23/5226 |
| 2017/0178970 A1 | 6/2017 | Anderson et al. |
| 2017/0256645 A1 | 9/2017 | Chung et al. |
| 2018/0005895 A1 | 1/2018 | Cheng et al. |
| 2018/0005896 A1 | 1/2018 | Mallela et al. |
| 2018/0012993 A1 | 1/2018 | Cheng et al. |
| 2019/0103319 A1 | 4/2019 | Qi et al. |

OTHER PUBLICATIONS

Xin Miao et al., "High Threshold Voltage FET With the Same fin Height as Regular Threshold Voltage Vertical FET," U.S. Appl. No. 15/951,355, filed Apr. 12, 2018.

* cited by examiner

FIG. 10

HIGH THRESHOLD VOLTAGE FET WITH THE SAME FIN HEIGHT AS REGULAR THRESHOLD VOLTAGE VERTICAL FET

DOMESTIC PRIORITY

This application is a continuation of U.S. patent application Ser. No. 15/951,355, filed Apr. 12, 2018, the disclosure of which is incorporated by reference herein in its entirety.

BACKGROUND

The present invention generally relates to fabrication methods and resulting structures for semiconductor devices, and more specifically, to forming high threshold voltage vertical FETs with the same fin height as regular/low threshold voltage vertical FETs.

The MOSFET is a transistor used for amplifying or switching electronic signals. The MOSFET has a source, a drain, and a metal oxide gate electrode. The metal gate is electrically insulated from the main semiconductor n-channel or p-channel by a thin layer of insulating material, for example, silicon dioxide or glass, which makes the input resistance of the MOSFET relatively high. The gate voltage controls whether the current path from the source to the drain is an open circuit ("off") or a resistive path ("on"). N-type field effect transistors (NFET) and p-type field effect transistors (PFET) are two types of complementary MOSFETs. The NFET includes n-doped source and drain junctions and uses electrons as the current carriers. The PFET includes p-doped source and drain junctions and uses holes as the current carriers.

One type of MOSFET is a non-planar FET known generally as a vertical FET (VFET). VFETs employ semiconductor fins and side-gates that can be contacted outside the active region, resulting in increased device density and some increased performance over lateral devices. In VFETs the source to drain current flows in a direction that is perpendicular to a major surface of the substrate. For example, in a known VFET configuration a major substrate surface is horizontal and a vertical fin extends upward from the substrate surface. The fin forms the channel region of the transistor. A source region and a drain region are situated in electrical contact with the top and bottom ends of the channel region, while a gate is disposed on one or more of the fin sidewalls.

SUMMARY

Embodiments of the invention are directed to a method for forming a semiconductor device. A non-limiting example of the method includes forming a first vertical fin with a first gate stack and a second vertical fin with a second gate stack. The second vertical fin has a hardmask on top. The first vertical fin is adjacent to a first bottom source or drain (S/D) region and the second vertical fin is adjacent to a second bottom S/D region. The method includes reducing the first gate stack to a first gate length and the second gate stack to a second gate length, the second gate length being greater than the first gate length because of the hardmask. Also, the method includes removing the hardmask and forming a first top S/D region adjacent to the first vertical fin and a second top S/D region adjacent to the second vertical fin.

Embodiments of the invention are directed to a semiconductor device. A non-limiting example of the semiconductor device includes a first vertical fin with a first gate stack and a second vertical fin with a second gate stack. The first vertical fin and the second vertical fin are substantially a same fin length. The first gate stack has a first gate length and the second gate stack has a second gate length, the second gate length being greater than the first gate length. The semiconductor device includes a bi-layer top spacer formed on top of the first and second gate stacks. The semiconductor device includes a first bottom S/D region adjacent to the first vertical fin and a second bottom S/D region adjacent to the second vertical fin. Also, the semiconductor device includes a first top S/D region adjacent to the first vertical fin and a second top S/D region adjacent to the second vertical fin.

Embodiments of the invention are directed to a method for forming a semiconductor device. A non-limiting example of the method includes forming a first vertical fin with a first gate stack and a second vertical fin with a second gate stack. The first vertical fin and the second vertical fin are substantially a same fin length. The first gate stack has a first gate length and the second gate stack has a second gate length, the second gate length being greater than the first gate length. The method includes forming a bi-layer top spacer on top of the first and second gate stacks. Also, the method includes forming a first bottom S/D region adjacent to the first vertical fin and a second bottom S/D region adjacent to the second vertical fin, and forming a first top S/D region adjacent to the first vertical fin and a second top S/D region adjacent to the second vertical fin.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 10 depicts a cross-sectional view of the semiconductor structure after fabrication operations according to embodiments of the invention.

Figure 1:
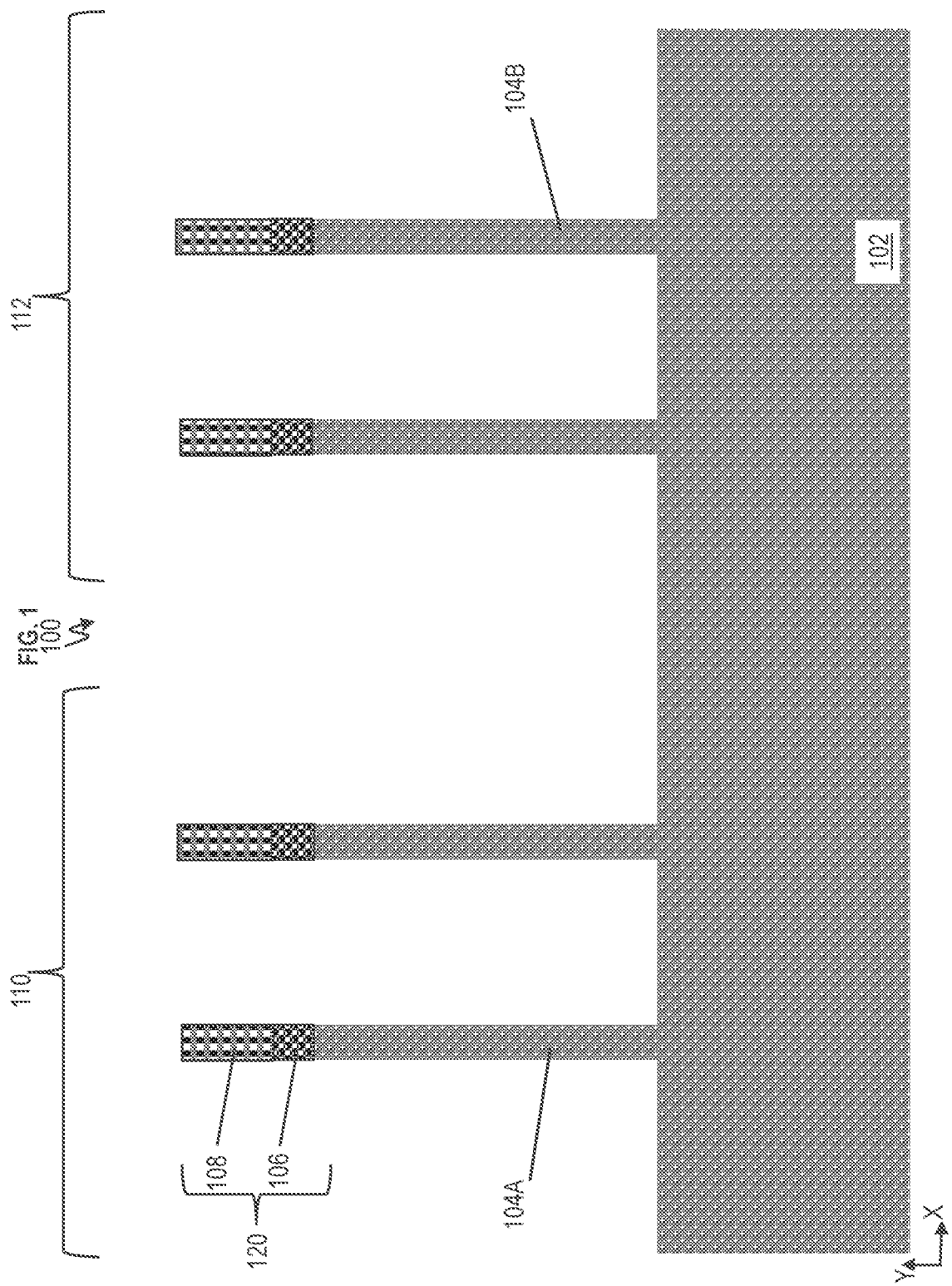
FIG. 1 depicts a cross-sectional view of a semiconductor structure after fabrication operations according to embodiments of the invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the embodiments of the invention, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, for lateral FETs, "wimpy" FETs are transistors that have a longer gate length than nominal FETs. Fabricating wimpy and nominal lateral transistors on the same substrate does not present insurmountable fabrication issues. However, for VFETs, it is difficult to fabricate on the same substrate in a controllable fashion nominal and "wimpy" VFETs having different gate lengths. Wimpy VFETs are transistors with a longer gate length and lower leakage current than the nominal VFETs. Wimpy VFETs are needed in non-critical paths to reduce chip power consumption.

Turning now to an overview of the aspects of the invention, one or more embodiments of the invention address the above-described shortcomings of the prior art by providing a semiconductor device and a method of forming the semiconductor device. Embodiments of the invention describe how to make wimpy VFETs which are VFETs with a shifted threshold voltage and longer gate length. The shifted threshold voltage VFET has a typical threshold voltage shift (increase) by 10-40 mV by having 2-5 nm longer gate length than the nominal VFET, thereby resulting in a higher threshold voltage. The use of the shifted threshold voltage VFET is to save standby power for circuits in non-critical circuit paths. Further, embodiments of the invention describe how to make shifted threshold voltage VFETs, which can be high threshold voltage VFETs (i.e., "wimpy" VFETs), in conjunction with making regular/low threshold voltage VFETs (i.e., nominal VFETs) on the same substrate. The shifted threshold voltage VFETs (high threshold voltage VFETs) and the regular/low threshold voltage VFETs (nominal VFETs) are made with the same fin height, which is enabled by multiple layer fin etch hardmasks. The shifted threshold voltage VFETs (high threshold voltage VFETs) and the regular/low threshold voltage VFETs (nominal) have different gate lengths (LG), resulting in different threshold voltages without requiring different work-function metals. Accordingly, embodiments of the invention decouple the gate length from the device footprint in VFETs while providing the high threshold voltage and regular/low threshold voltage FETs with the same fin height. Having the same fin height reduces fabrication processes in the semiconductor device.

Turning now to a more detailed description of aspects of the present invention, FIG. 1 depicts a cross-sectional view of a semiconductor device 100 according to embodiments of the invention. A substrate 102 has been patterned to form multiple vertical fins 104A and 104B, using standard lithography processes. The substrate 102 is a semiconductor material. The substrate 102 can be a silicon substrate, although other materials can be used as the substrate 102. The substrate can be, for example, a III-V semiconductor substrate or a silicon-on-insulator substrate. The vertical fins 104A and 104B can be doped as desired, with n-type dopants or p-type dopants.

A bottom hardmask 106 is formed on top of the vertical fins 104A and 104B. A top hardmask 108 is formed on top of the bottom hardmask 106. The bottom and top hardmasks 106 and 108 together form a bi-layer hardmask 120. The bottom and top hardmask 106 and 108 are materials that have different etching selectivity. The bottom hardmask 106, for example, can be SiOC. The top hardmask 108, for example, can be SiN. Other examples of the bottom hardmask 106 include SiN, SiBCN, SiOCN and other applicable dielectric materials, as long as the wanted etching selectivity among different dielectric materials is met. Other examples of the top hardmask 108 include SiOC, SiBCN, SiOCN and other applicable dielectric materials, as long as the wanted etching selectivity among different dielectric materials is met.

Figure 10:
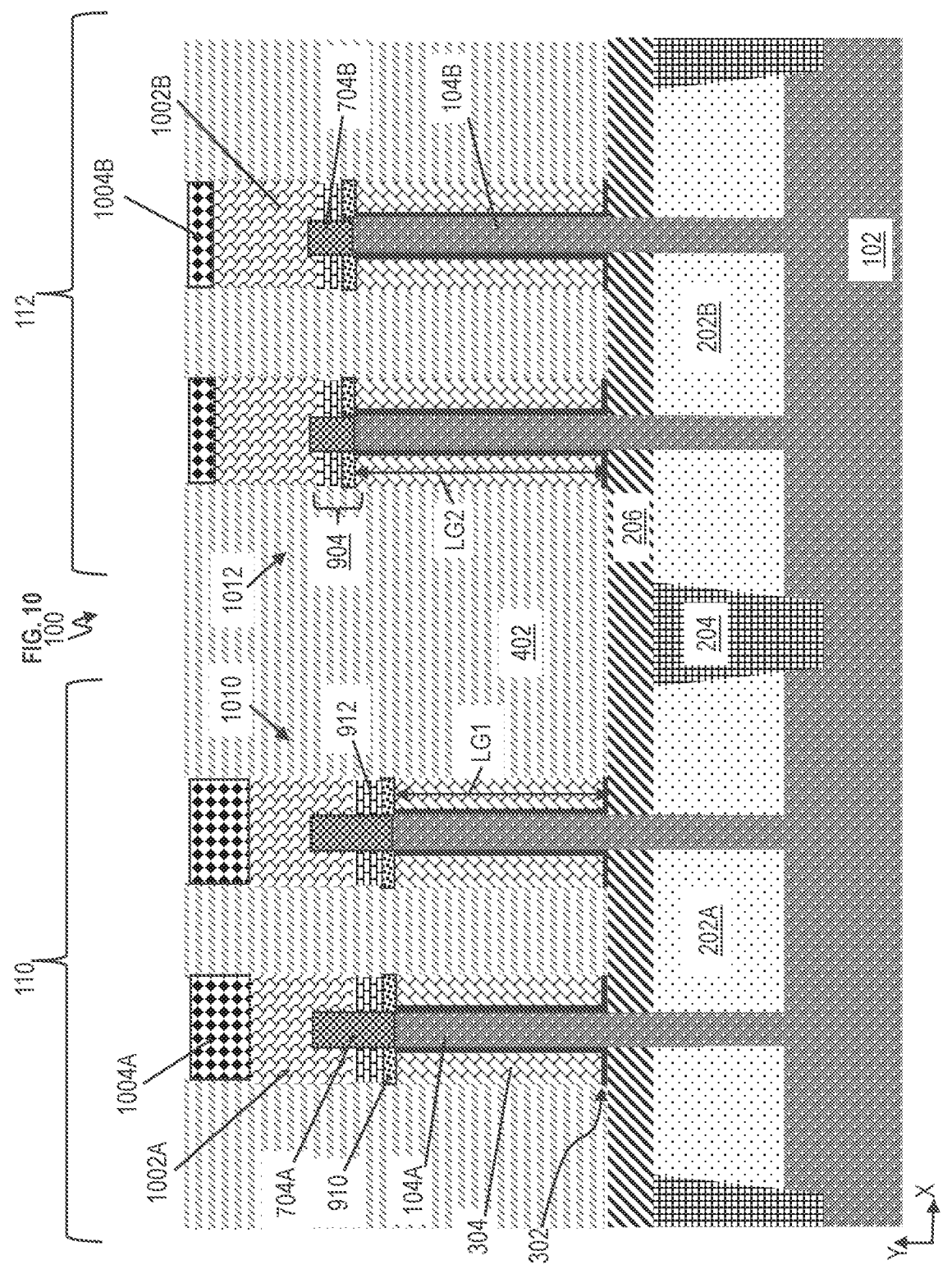

The fins 104A are in nominal device region 110, which is also referred to as the regular and/or low threshold voltage FET (e.g., depicted as transistors 1010 in FIG. 10). The fins 104B are in the high threshold voltage FET (e.g., depicted as transistors 1012 in FIG. 10), which is also known as the weak/"wimpy" device region/transistor.

Figure 2:
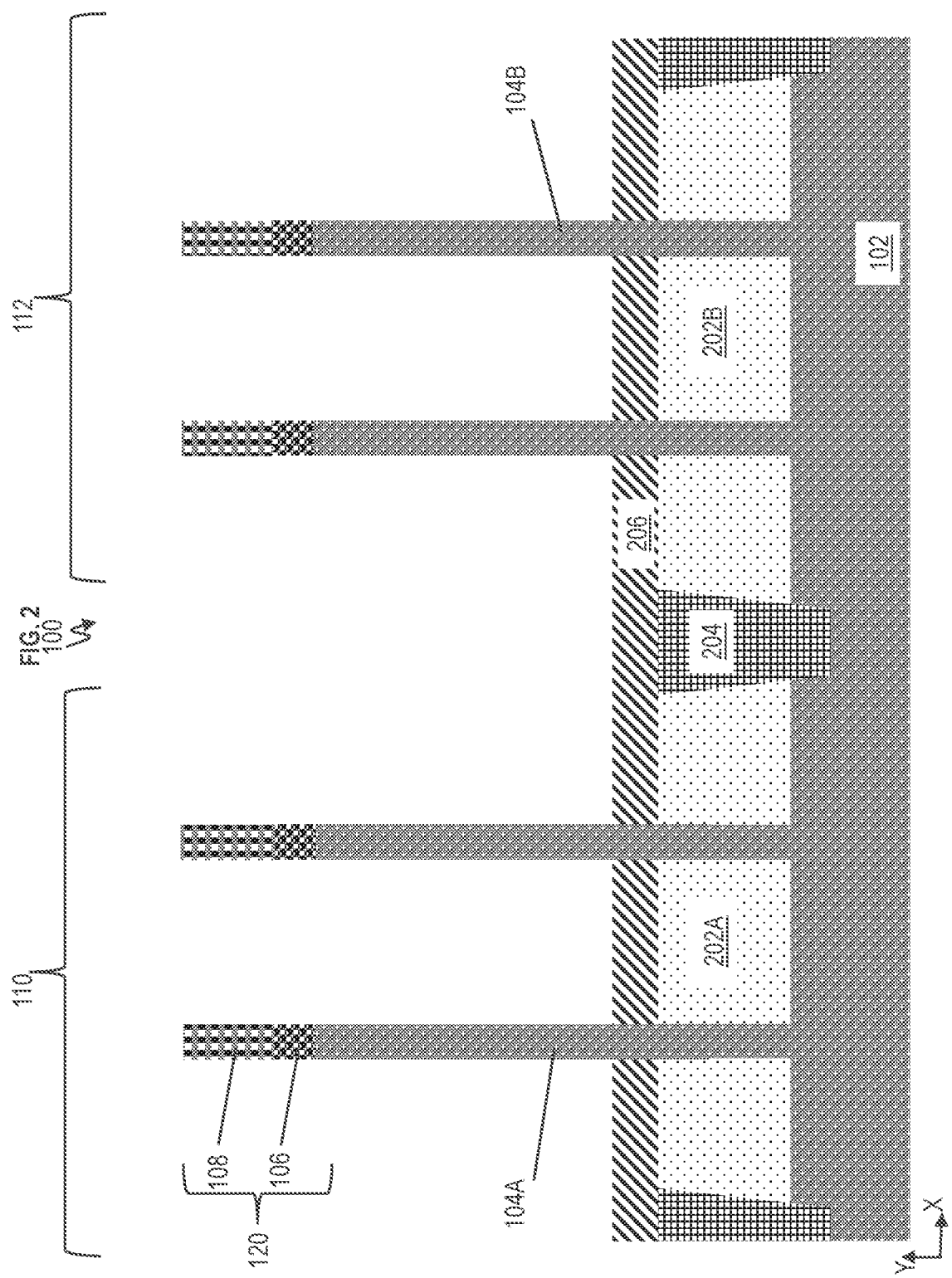
FIG. 2 depicts a cross-sectional view of the semiconductor structure after fabrication operations according to embodiments of the invention.

FIG. 2 depicts a cross-sectional view of the semiconductor device 100 according to embodiments of the invention. A liner (not shown) can be formed on the vertical fins 104A and 104B, and the substrate 102 is recessed. Bottom source/drain (S/D) regions 202A and 202B are epitaxially formed on the substrate 102. Shallow trench isolation (STI) regions 204 are formed in the bottom S/D regions 202A and 202B and in a portion of the substrate 102. The STI regions 204 separates the bottom S/D regions 202A in the regular/low threshold voltage region 110 from bottom S/D regions 202B in the high threshold voltage region 112. The STI regions 204 include a low-k dielectric material, such as, for example, a local oxide. The liner can be stripped from the fins 104A and 104B.

A bottom spacer 206 is formed on top of the STI regions 204 and the bottom S/D regions 202A and 202B. The bottom spacer 206, for example, can be SiBCN. Other examples of the bottom spacer 206 can include SiN, SiOC, SiOCN and other applicable dielectric materials, as long as the wanted etching selectivity is met among different dielectric materials. The bottom spacer 206 can be formed by directional deposition using, for example, high-density plasma (DHP), high-density plasma chemical vapor deposition (HDP-CVD), gas cluster ion beam (GCIB) deposition, etc.

Figure 3:
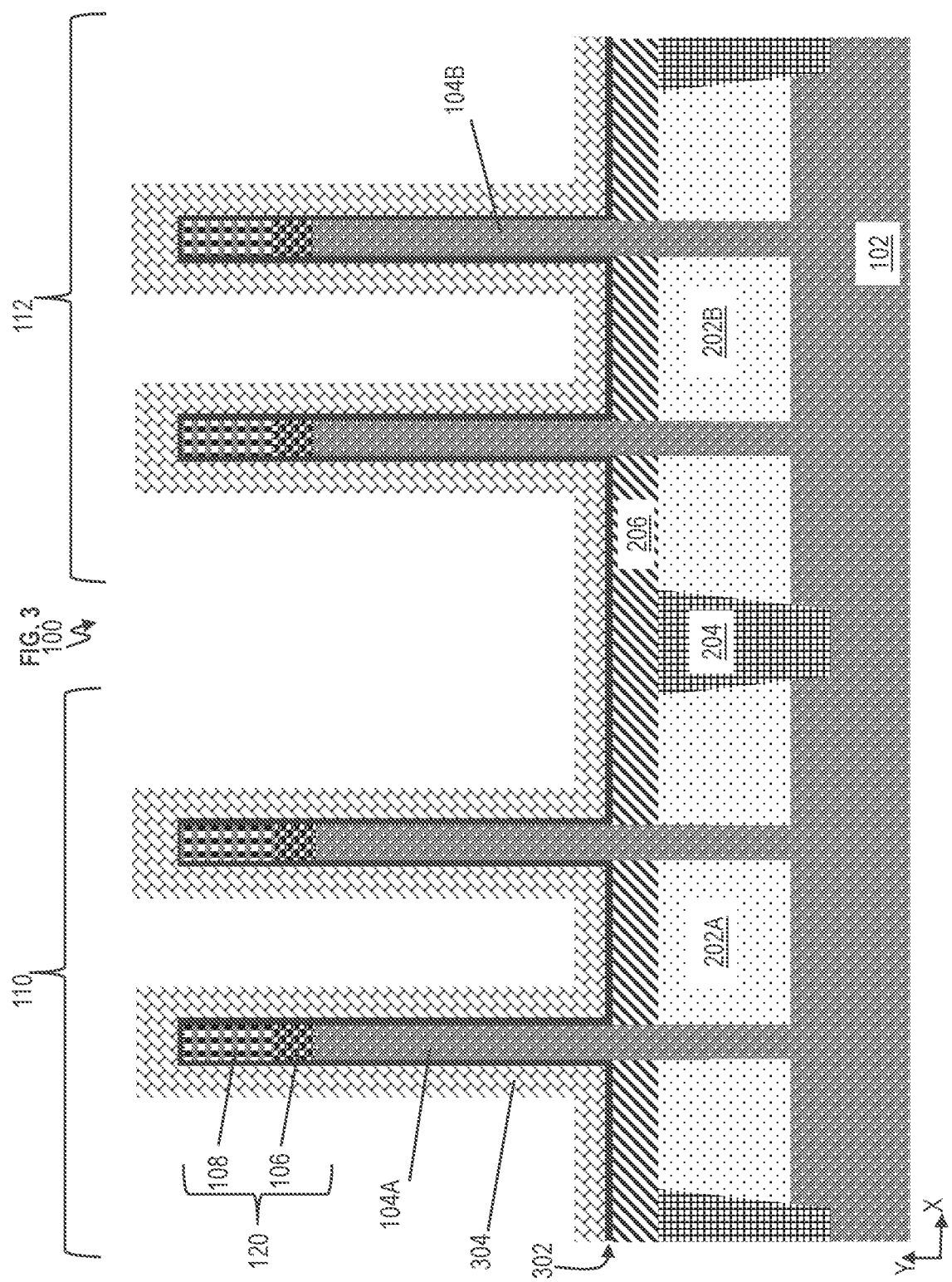
FIG. 3 depicts a cross-sectional view of the semiconductor structure after fabrication operations according to embodiments of the invention.

FIG. 3 depicts a cross-sectional view of a semiconductor device 100 according to embodiments of the invention. Conformal deposition of the metal gate stacks is performed. A high-k dielectric material 302 is formed on the fins 104A and 104B, and one or more gate metals 304 are formed on top of the high-k dielectric material 302, thereby forming the metal gate stack.

Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material can further include a dopant such as lanthanum or aluminum.

The one or more gate metals 304 can be work function metals formed, following deposition of the high-k dielectric material 302. The work function metal can be the same in both the regular/low threshold voltage region 110 and the high threshold voltage region 112 because making a shifted threshold voltage VFET (i.e., "wimpy" VFETs) with a shifted/increased threshold voltage is the result of having a longer gate length (LG2) than the regular/low threshold voltage VFET (i.e., nominal VFET) and not a different work function metal. Example work function metals can include TiN, TiC, TiAlC, TaN, or any other metals used in the state of the art.

Figure 4:
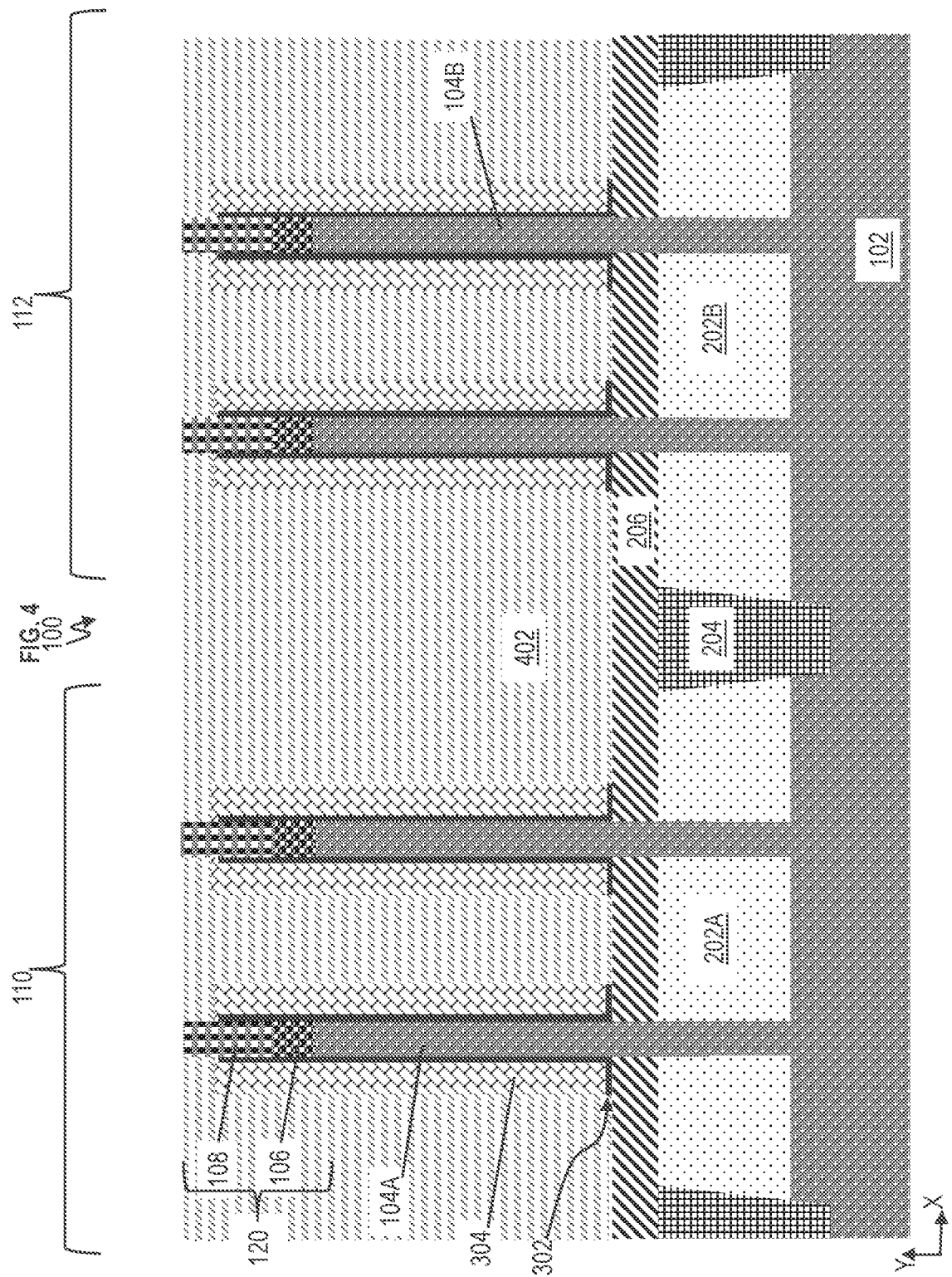
FIG. 4 depicts a cross-sectional view of the semiconductor structure after fabrication operations according to embodiments of the invention.

FIG. 4 depicts a cross-sectional view of the semiconductor device 100 according to embodiments of the invention. A directional etch is performed to etch back part of the metal gate stacks. The directional etch, for example, can be reactive ion etching (RIE). The directional etch removes the horizontal portion of the high-k dielectric material 302 on top of the bottom spacer 206 and on top of the fins 104A and 104B. Also, the directional etch removes the horizontal portion of the gate metal 304 on top of the bottom spacer 206 and on top of the fins 104A and 104B. Accordingly, the vertical gate stack remains on the fins 104A and 104B such that a top surface of the top hardmask 108 is exposed.

Additionally, an interlayer dielectric (ILD) material 402 is deposited. The ILD material 402 can be a low-k dielectric material, such as an oxide material. Chemical mechanical polishing/planarization (CMP) is performed to etch the ILD material 402 to the top of the top hardmask 108.

Figure 5:
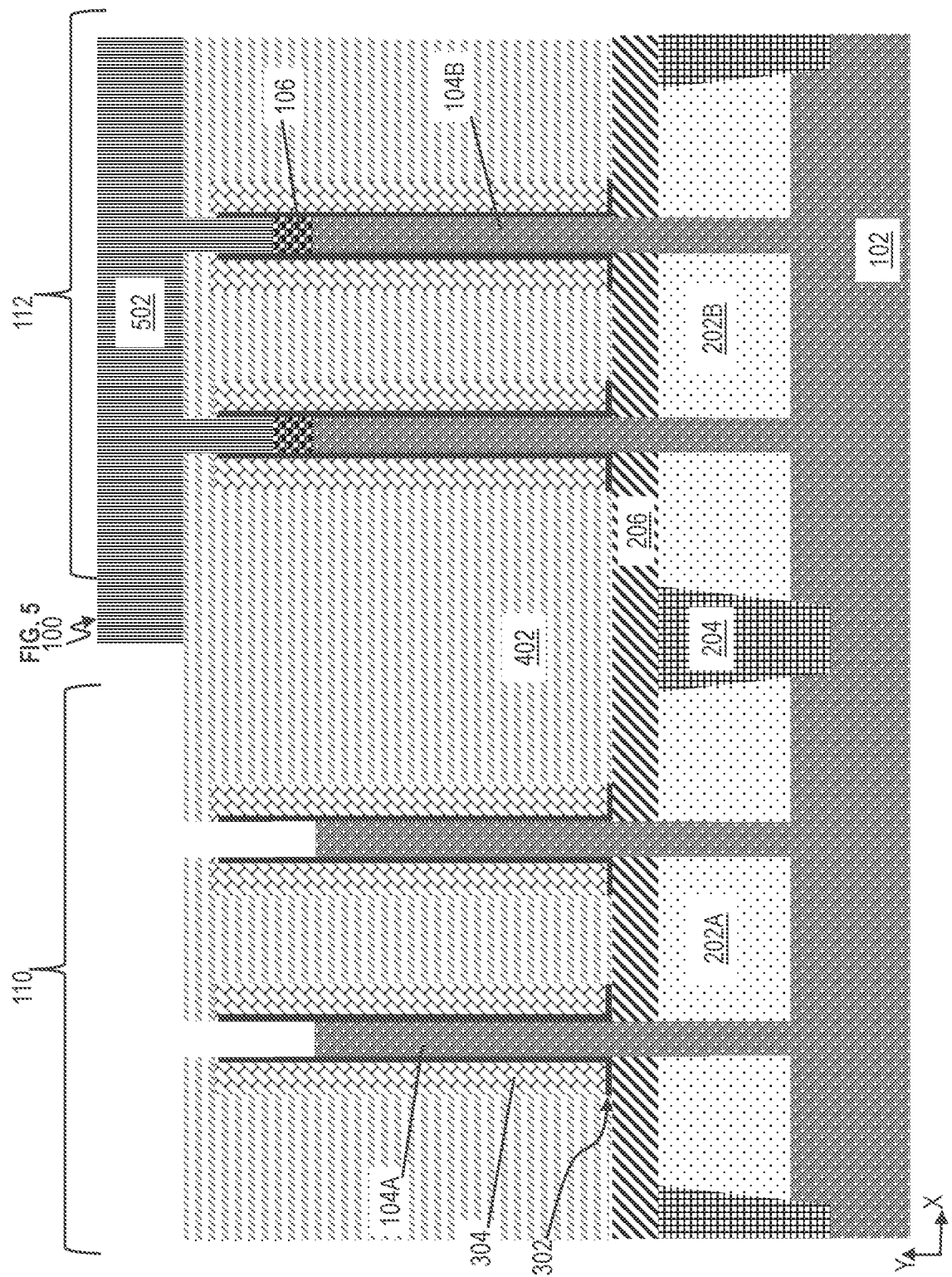
FIG. 5 depicts a cross-sectional view of the semiconductor structure after fabrication operations according to embodiments of the invention.

FIG. 5 depicts a cross-sectional view of a semiconductor device 100 according to embodiments of the invention. The top hardmask 108 is removed from both the regular/low threshold voltage region 110 and the high threshold voltage region 112. A selective etch is performed to remove the top hardmask 108 (e.g., SiN). A block mask 502 is formed on the high threshold voltage region 112 while a selective etch is performed to remove the bottom hardmask 106 (only) in the regular/low threshold voltage region 110. The block mask 502, for example, can be an organic planarization layer (OPL) that protects the side of the high threshold voltage region 112. Another example of the block mask 502 could be polydimethylsiloxane (PDMS). The top of the fins 104A are exposed.

Figure 6:
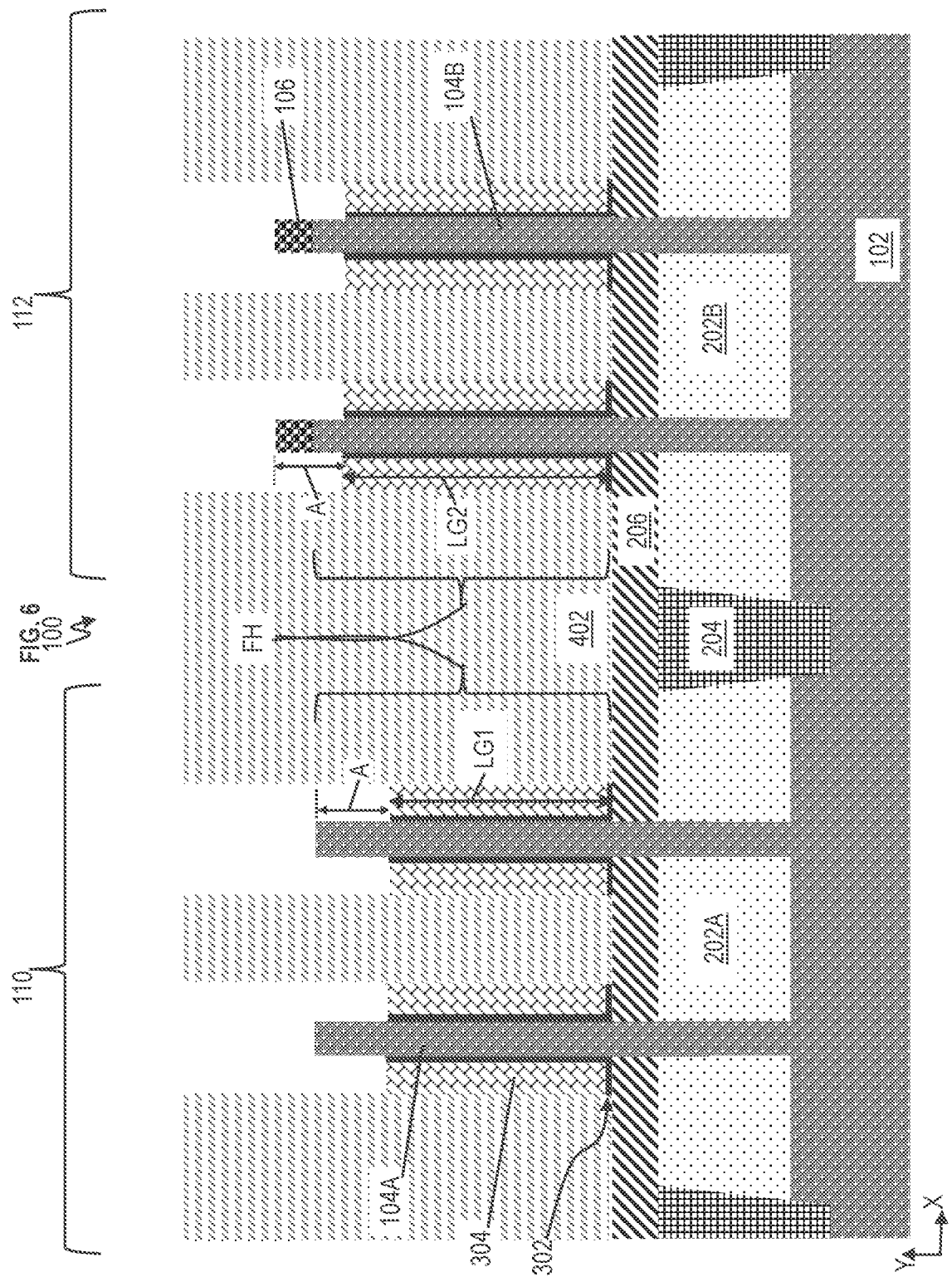
FIG. 6 depicts a cross-sectional view of the semiconductor structure after fabrication operations according to embodiments of the invention.

FIG. 6 depicts a cross-sectional view of the semiconductor device 100 according to embodiments of the invention. The block mask 502 is stripped from the high voltage threshold region 112, which leaves the top of the bottom hardmask 106 exposed in the high threshold voltage region 112.

Subsequently, an isotropic metal gate stack etch is performed to set the gate lengths (LG1 and LG2, respectively) for the regular/low threshold voltage region 110 and the high threshold voltage region 112. The isotropic etch is selective to etch the high-k dielectric material 302 and the gate metal 304. The isotropic etch also removes the portion of ILD material 402 above the high-k dielectric material 302 and the gate metal 304 in both the regular/low threshold voltage region 110 and the high threshold voltage region 112. The gate length difference, which is LG2−LG1, is set by the thickness of the bottom hardmask 106. The thickness of the bottom hardmask 106 is its height in the y-axis. The height A designates the height of material above the high-k dielectric material 302 and gate metal 304 in both the regular/low threshold voltage region 110 and the high threshold voltage region 112. For example, the height A is measured from the top of the fin 104A to the top of the high-k dielectric material 302/gate metal 304 (i.e., metal gate stack) in the regular/low threshold voltage region 110. The height A is measured from the top of the bottom hardmask 106 (which is on top fin 104B) to the top of the high-k dielectric material 302/gate metal 304 (i.e., metal gate stack) in the high threshold voltage region 112. In both cases, the height A is equal.

The isotropic etch pulls down the high-k dielectric material 302/gate metal 304 to create different gate lengths, which are LG1 in the regular/low threshold voltage region 110 and LG2 is the high threshold voltage region 112. To create the different gate lengths LG1 and LG2, the isotropic etch has a lateral phase which (first) etches the high-k dielectric material 302/gate metal 304 laterally (in the x-axis) and a vertical phase which (then) etches the high-k dielectric material 302/gate metal 304 vertically (in the y-axis). The lateral phase removes the high-k dielectric material 302/gate metal 304 above the top of fin in the regular/low threshold voltage region 110 and above the top of bottom hardmask 106 in the high threshold voltage region 112. The vertical phase then etches high-k dielectric material 302/gate metal 304 downward with the same depth in the regular/low threshold voltage region 110 and in the high threshold voltage region 112, creating the equal height A. The bottom hardmask 106 causes the gate length LG2 to be longer/greater than the gate length LG1. The isotropic etch can be a wet or dry etch. An example of the etchant, for example, can be an etchant containing $NH_4OH$, $H_2O_2$, deionized water, HCl and HF. Although the isotropic etch is called one step, the application of the etchants listed above can be in any preferred order.

The gate length LG2, for example, can be 2-5 nm longer than the gate length LG1 of the regular/low threshold voltage region 112. In some implementations, the difference in gate length can be greater in direct correlation to the height of the bottom hardmask 106 remaining in the regular/low threshold voltage region 112. The high threshold voltage of the FETs in the high threshold voltage region 112, for example, can be 10-40 millivolts (mV) higher than the regular/low threshold voltage of the FETs in the regular/low threshold voltage region 110. The fins 104A and 104B have the same fin height FH although their gate lengths are different as measured from the bottom spacer 206 (or any surface perpendicular to the vertical direction of the fins 104A and 104B).

Figure 7:
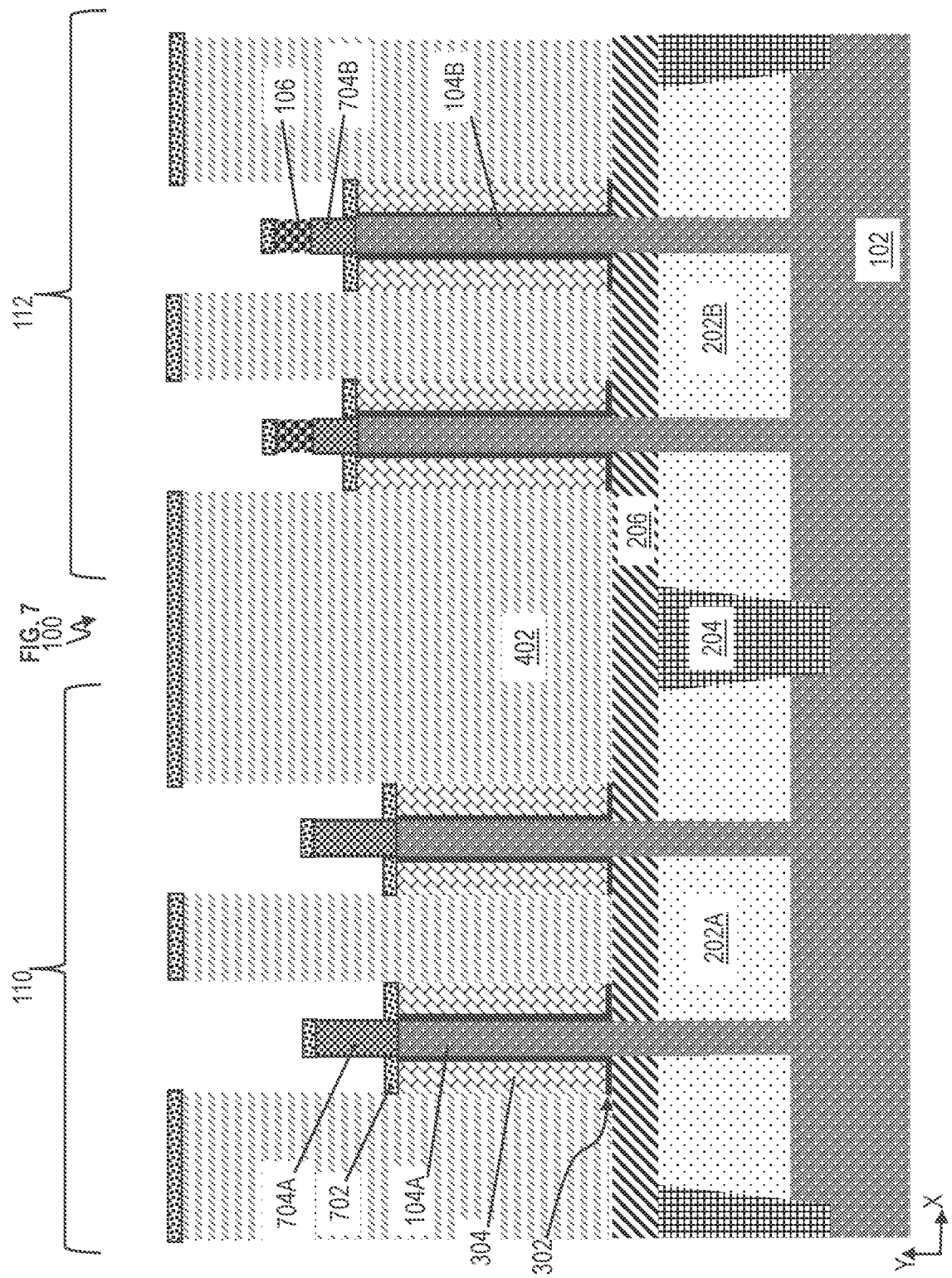
FIG. 7 depicts a cross-sectional view of the semiconductor structure after fabrication operations according to embodiments of the invention.

FIG. 7 depicts a cross-sectional view of the semiconductor device 100 according to embodiments of the invention. A thin layer of gate cap dielectric material 702 is formed via directional deposition on top of the fins 104A, the bottom fin etch hardmask 106, the high-k dielectric material 302, gate metal 304, and ILD material 402. The directional deposition to form the gate cap dielectric material 702 can be, for example, high-density plasma (DHP), high-density plasma chemical vapor deposition (HDP-CVD), gas cluster ion beam (GCIB) deposition, etc. The gate cap dielectric material 702 is to serve as part of the top spacer. The gate cap dielectric material 702, for example, can be SiBCN. Other examples of the gate cap dielectric material 702 can include SiN, SiOC, SiOCN and other applicable dielectric materials.

The top of the fins 104A and fins 104B are doped to formed doped fin tops 704A and doped fins tops 704B, respectively. The doped fin tops 704A and 704B, for example, can be doped using plasma doping, or borosilicate glass (BSG) and phosphosilicate glass (PSG) doping. The BSG/PSG doping deposits the BSG/PSG films, and then annealing drives the dopants in the desired material. The gate cap dielectric material 702 protects the gate stack (i.e., the high-k dielectric material 302 and gate metal 304) during the doping process. The doped fin tops 704A and 704B can be doped with n-type or p-type dopants as desired.

Figure 8:
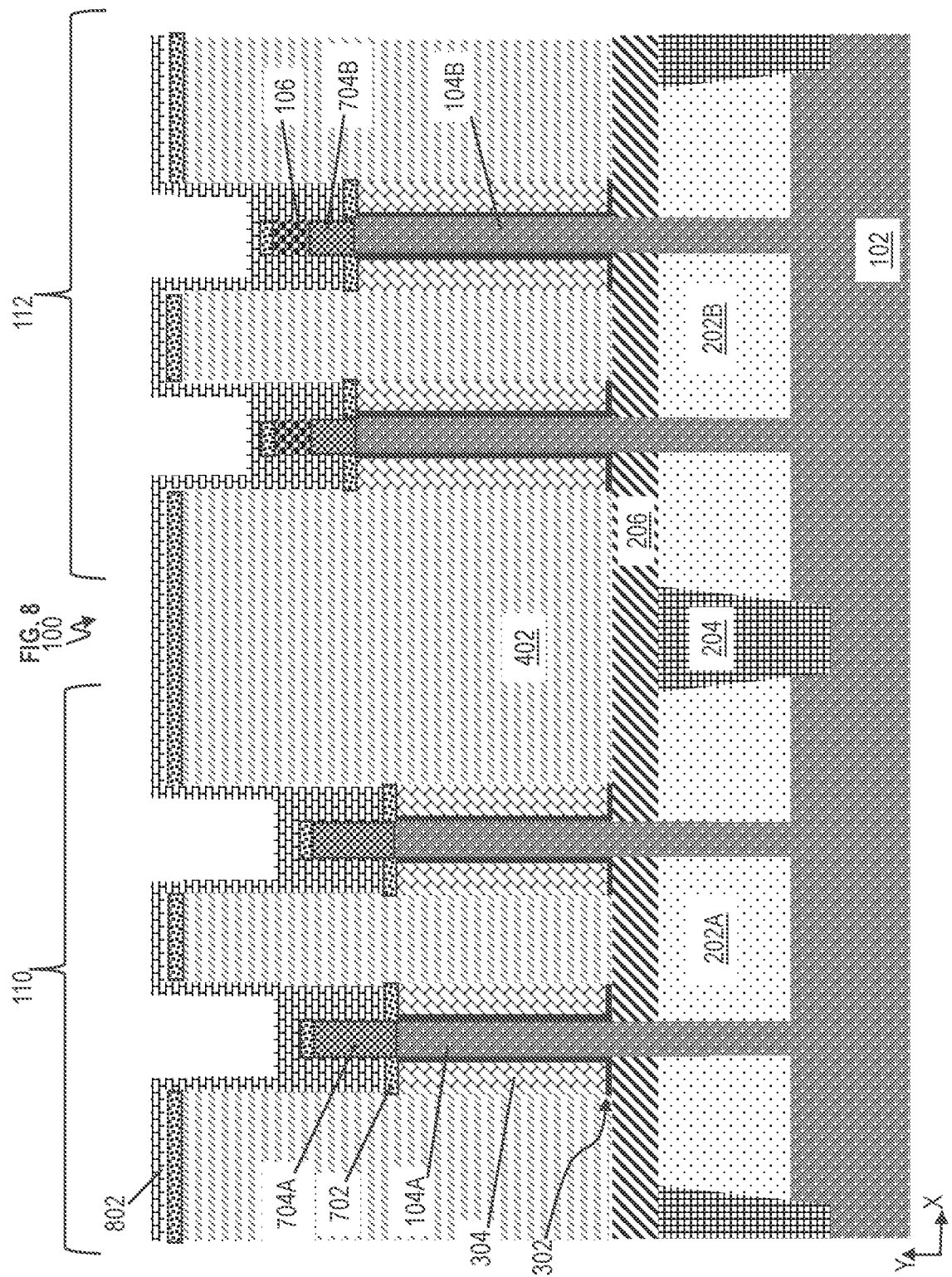
FIG. 8 depicts a cross-sectional view of the semiconductor structure after fabrication operations according to embodiments of the invention.

FIG. 8 depicts a cross-sectional view of the semiconductor device 100 according to embodiments of the invention. Conformal deposition of a top spacer material 802 is performed. Pinch-off of the top spacer material 802 occurs in the trenches with the respective doped top fins 704A and 704B. Examples of the top spacer material 802 can include SiBCN, SiN, SiOC, SiOCN and other applicable dielectric materials.

Figure 9:
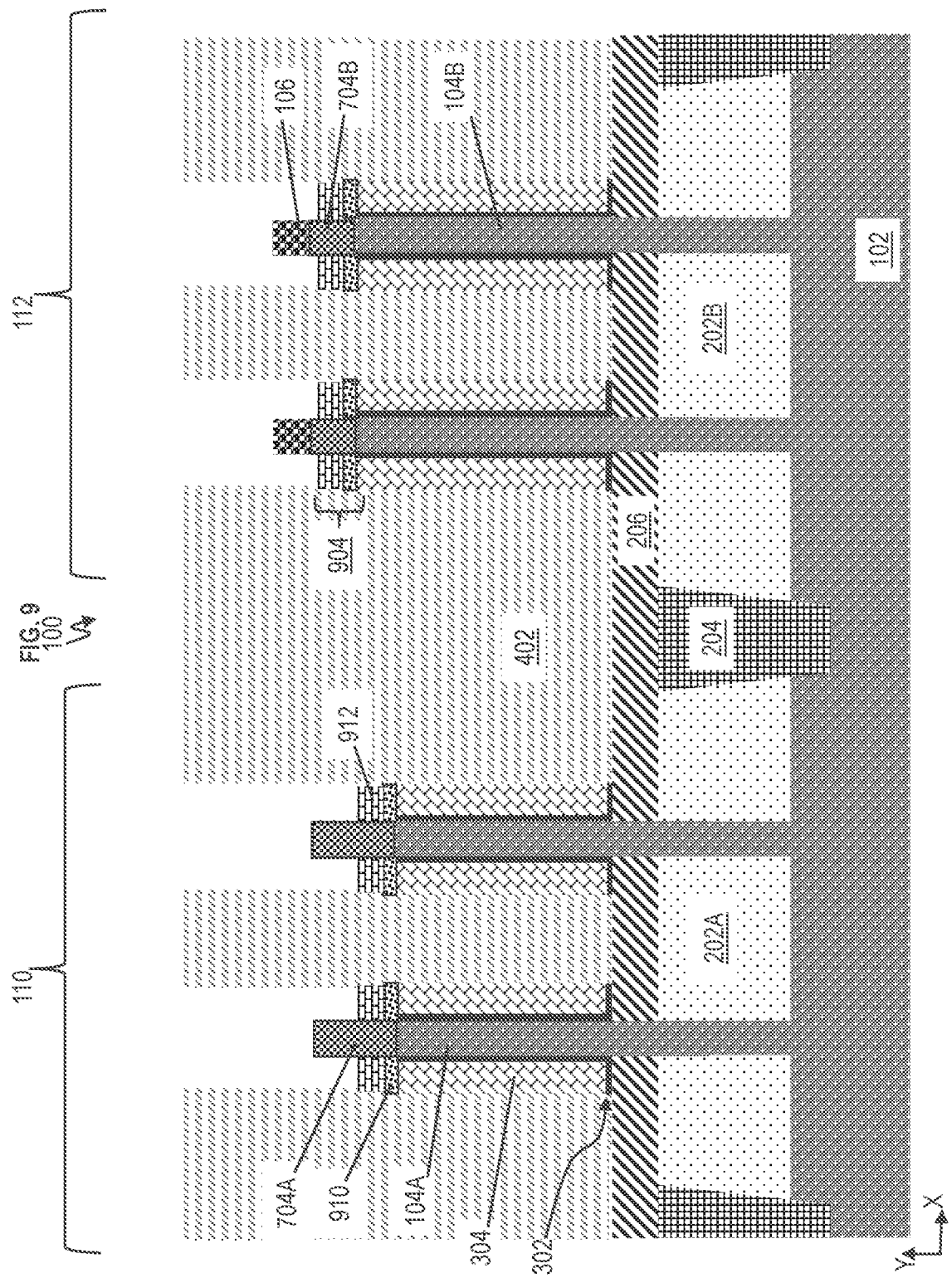
FIG. 9 depicts a cross-sectional view of the semiconductor structure after fabrication operations according to embodiments of the invention.

FIG. 9 depicts a cross-sectional view of the semiconductor device 100 according to embodiments of the invention. An isotropic etch (wet or dry etch) of the top spacer material 802 and gate cap material 702 (depicted in FIG. 8) is performed to form the first and second top spacers, which is a bi-layer top spacer 904. The bi-layer top spacer 904 includes the first top spacer 910 which is the remaining part of the gate cap material 702 and the second top spacer 912 which is the remaining part of the top spacer material 802. An example of the etchant for the isotropic etch can be an etchant that contains diluted HF, $H_3PO_4$, KOH and any other applicable chemicals. The bi-layer top spacer 904 is directly on top of the gate stack (i.e., the high-k dielectric material 302 and gate metal 304).

FIG. 10 depicts a cross-sectional view of the semiconductor device 100 according to embodiments of the invention. The bottom fin etch hardmask 106 is removed from the high threshold voltage region 112. The top source/drain (S/D) 1002A is epitaxially grown from the doped top fin 704A in the regular/low threshold voltage region 110, resulting in the regular/low threshold voltage FET 1010. Similarly, the top source/drain (S/D) 1002B is epitaxially grown from the doped top fin 704B in the high threshold voltage region 112, resulting in the high threshold voltage FET 1012.

The tops of the top S/D 1002A and 1002B are coated with a dielectric material to form epitaxial caps 1004A and 1004B, and CMP is performed to the top of the ILD material 402. As understood by one skilled in the art, further downstream processing occurs to form, for example, contacts, etc.

According to one or more embodiments of the invention, a method of forming a semiconductor device 100 is provided. The method includes forming a first vertical fin 104A with a first gate stack (e.g., high-k dielectric material 302 and gate metal 304 in region 110) and a second vertical fin 104B with a second gate stack (e.g., high-k dielectric material 302 and gate metal 304 in region 112), where the second vertical fin 104B has a hardmask (e.g., first hardmask 106) on top, and where the first vertical fin 104A is adjacent to a first bottom source/drain region 202A and the second vertical fin 104B is adjacent to a second bottom source/drain region 202B. The method includes reducing the first gate stack to a first gate length (e.g., gate length LG1) and the second gate stack to a second gate length (e.g., gate length LG2), where the second gate length is greater than the first gate length (e.g., LG2>LG1) because of the hardmask (e.g., first hardmask 106). The method includes removing the hardmask (e.g., first hardmask 106) and forming a first top source/drain region 1002A adjacent to the first vertical fin 104A and a second top source/drain region 1002B adjacent to the second vertical fin 104B.

Also, the method forming a first top spacer (e.g., first top spacer 910 on the first gate stack and the second gate stack. The method includes doping a first upper portion 704A of the first vertical fin 104A and a second upper portion 704B of the second vertical fin 704B, after forming a first top spacer (e.g., first top spacer 910) on the first and second gate stacks. The first top source/drain region 1002A is epitaxially grown from the first upper portion 704A having been doped and the second top source/drain region 1002B is epitaxially grown from the second upper portion 704B having been doped.

The method include forming a second top spacer 912 on the first top spacer 910. The first and second upper portions 704A and 704B extend above the first and second top spacers 910 and 912.

The first vertical fin 104A and the second vertical fin 104B are substantially a same fin length or fin height FH (in the y-axis). The first gate stack and the second gate stack each includes a high-k dielectric material 302 and at least one gate metal 304.

A first vertical transistor 1010 includes the first vertical fin 104A and the first gate stack and a second vertical transistor 1012 includes the second vertical fin 104B and the second gate stack. The second vertical transistor 1012 has a higher threshold voltage than the first transistor 1010 defined by the second gate length (e.g., LG2) being greater than the first length (e.g., LG1). The second vertical transistor 1012 is defined to have a lower leakage current (e.g., a lower off current) than the first vertical transistor 1010 because the second gate length (e.g., LG2) is greater than the first gate length (e.g., LG1).

According to one or more embodiments of the invention, a semiconductor device 100 includes a first vertical fin 104A with a first gate stack and a second vertical fin 104B with a second gate stack, where the first vertical fin 104A and the second vertical fin 104A are substantially a same fin length (e.g., fin height FH), where the first gate stack has a first gate length (e.g., LG1) and the second gate stack has a second gate length (e.g., LG2), the second gate length being greater than the first gate length. A bi-layer top spacer 904 is formed on top of the first and second gate stacks. A first bottom source/drain region 202A is adjacent to the first vertical fin 104A and a second bottom source/drain region 202B is adjacent to the second vertical fin 104B. A first top source/drain region 1002A is adjacent to the first vertical fin 104A and a second top source/drain region 1002B is adjacent to the second vertical fin 104B.

The bi-layer top spacer 904 includes a first top spacer 910 and a second top spacer 912 formed on the first top spacer 910. The first and second top spacers include different materials. A first epitaxial cap 1004A is on top of the first top source/drain region 1002A and a second epitaxial cap 1004B is on top of the second top source/drain region 1002B. The first and second epitaxial caps 1004A and 1004B are different lengths in the y-axis. Top surfaces of the first top source/drain region 1002A and the second top source/drain region 1002B are at different heights. The top surface of the second top source/drain region 1002B is above the top surface of the first top source/drain region 1002A.

According to one or more embodiments of the invention, a method of forming a semiconductor device 100 is provided. The method includes forming a first vertical fin 104A with a first gate stack and a second vertical fin 104B with a second gate stack, where the first vertical fin 104A and the second vertical fin 104B are substantially a same fin length (e.g., fin height FH), where the first gate stack has a first gate length LG1 and the second gate stack has a second gate length LG2, the second gate length being greater than the first gate length. The method includes forming a bi-layer top spacer 904 on top of the first and second gate stacks and forming a first bottom source/drain region 202A adjacent to the first vertical fin 104A and a second bottom source/drain region 202B adjacent to the second vertical fin 104B. The method includes forming a first top source/drain region 1002A adjacent to the first vertical fin 104A and a second top source/drain region 1002B adjacent to the second vertical fin 104B.

Terms such as "epitaxial growth" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A semiconductor device comprising:
 a first vertical fin with a first gate stack and a second vertical fin with a second gate stack, wherein the first vertical fin and the second vertical fin comprise a fin length, the first vertical fin comprising first fin length sides extending along the fin length, the second vertical fin comprising second fin length sides extending along the fin length, wherein the first gate stack has a first gate length and the second gate stack has a second gate length, the second gate length being greater than the first gate length;
 a top spacer formed on top of the first and second gate stacks;
 a first bottom S/D region formed in direct contact with a portion of the first fin length sides of the first vertical fin and a second bottom S/D region formed in direct contact with a portion the second fin length sides of the second vertical fin; and
 a first top S/D region adjacent to the first vertical fin and a second top S/D region adjacent to the second vertical fin.

2. The semiconductor device of claim 1, wherein the top spacer comprises a first top spacer and a second top spacer formed on the first top spacer.

3. The semiconductor device of claim 2, wherein the first and second top spacers comprise different materials.

4. The semiconductor device of claim 1, wherein a first epitaxial cap is on top of the first top S/D region and a second epitaxial cap is on top of the second top S/D region.

5. The semiconductor device of claim 4, wherein the first and second epitaxial caps are different lengths.

6. The semiconductor device of claim 1, wherein top surfaces of the first top S/D region and the second top S/D region are at different heights.

7. The semiconductor device of claim 1, wherein a first vertical transistor includes the first vertical fin and the first gate stack.

8. The semiconductor device of claim 7, wherein a second vertical transistor includes the second vertical fin and the second gate stack.

9. The semiconductor device of claim 8, wherein the second gate length being greater than the first gate length results in the second vertical transistor having a lower leakage current than the first vertical transistor.

10. A method of forming a semiconductor device, the method comprising:
 forming a first vertical fin with a first gate stack and a second vertical fin with a second gate stack, wherein the first vertical fin and the second vertical fin comprise a fin length, the first vertical fin comprising first fin length sides extending along the fin length, the second vertical fin comprising second fin length sides extending along the fin length, wherein the first gate stack has a first gate length and the second gate stack has a second gate length, the second gate length being greater than the first gate length;
 forming a top spacer on top of the first and second gate stacks;
 forming a first bottom S/D region in direct contact with a portion of the first fin length sides of the first vertical fin and a second bottom S/D region in direct contact with a portion of the second fin length sides of the second vertical fin; and
 forming a first top S/D region adjacent to the first vertical fin and a second top S/D region adjacent to the second vertical fin.

11. The method of claim 10, wherein the top spacer comprises a first top spacer and a second top spacer formed on the first top spacer.

12. The method of claim 11, wherein the first and second top spacers comprise different materials.

13. The method of claim 10, wherein a first epitaxial cap is on top of the first top S/D region and a second epitaxial cap is on top of the second top S/D region.

14. The method of claim 13, wherein the first and second epitaxial caps are different lengths.

15. The method of claim 10, wherein top surfaces of the first top S/D region and the second top S/D region are at different heights.

16. The method of claim 10, wherein a first vertical transistor includes the first vertical fin and the first gate stack.

17. The method of claim 16, wherein a second vertical transistor includes the second vertical fin and the second gate stack.

18. The method of claim 17, wherein the second gate length being greater than the first gate length results in the second vertical transistor having a lower leakage current than the first vertical transistor.

19. A method of forming a semiconductor device, the method comprising:

forming a first vertical fin with a first gate stack and a second vertical fin with a second gate stack, wherein the first vertical fin and the second vertical fin comprise a fin length, the first vertical fin comprising first fin length sides extending along the fin length, the second vertical fin comprising second fin length sides extending along the fin length;

decreasing the first gate stack to a first gate length, the second gate stack having a second gate length greater than the first gate length;

forming a top spacer on top of the first and second gate stacks;

forming a first bottom S/D region in direct contact with a portion of the first fin length sides of the first vertical fin and a second bottom S/D in direct contact with a portion of the second fin length sides of the second vertical fin; and forming a first top S/D region adjacent to the first vertical fin and a second top S/D region adjacent to the second vertical fin.

20. The method of claim 19, wherein the top spacer comprises a first top spacer and a second top spacer formed on the first top spacer.

* * * * *